(12) United States Patent
Yamamoto et al.

(10) Patent No.: US 6,765,879 B2
(45) Date of Patent: Jul. 20, 2004

(54) COMMUNICATIONS APPARATUS, FREQUENCY CONTROL METHOD FOR COMMUNICATIONS APPARATUS, AND RECORDING MEDIUM

(75) Inventors: Naoyuki Yamamoto, Kanagawa (JP); Shinichiro Miyashita, Kanagawa (JP)

(73) Assignee: Matsushita Electric Industrial Co. Ltd., Osaka (JP)

( * ) Notice: Subject to any disclaimer, the term of this patent is extended or adjusted under 35 U.S.C. 154(b) by 803 days.

(21) Appl. No.: 09/735,753

(22) Filed: Dec. 13, 2000

(65) Prior Publication Data

US 2001/0005375 A1 Jun. 28, 2001

(30) Foreign Application Priority Data

Dec. 14, 1999 (JP) .......................................... P 11-354737

(51) Int. Cl.[7] .......................... G01R 31/08; H04Q 7/00; H04J 3/00
(52) U.S. Cl. ....................... 370/252; 370/329; 370/327; 370/436; 455/234.2; 331/23
(58) Field of Search ................................ 370/252, 329, 370/331, 328, 278, 347, 337, 436; 455/68, 71, 234.2; 375/306, 344

(56) References Cited

U.S. PATENT DOCUMENTS 5,500,878 A * 3/1996 Iwasaki ........................ 375/344
6,567,480 B1 * 5/2003 Brardjanian et al. ........ 375/331

FOREIGN PATENT DOCUMENTS

| GB | 2 342 796 A | 4/2000 |
| JP | 09-162936 | 6/1997 |
| JP | 09-164531 | 6/1997 |
| WO | 98/17012 A1 | 4/1998 |

* cited by examiner

Primary Examiner—Duc Ho
(74) Attorney, Agent, or Firm—Pearne & Gordon LLP

(57) ABSTRACT

A communications apparatus and a frequency control method thereof, in that control of a reference frequency (local oscillator frequency) is made by feeding back a frequency offset estimate FOS to the voltage-controlled oscillator 103, and the frequency offset between sending and receiving frequencies is corrected by feeding back a frequency offset control value FOC which is based on a sending reference frequency command on downstream control data DCD to sending frequency offset control means 118, to control a sending reference frequency by using both a voltage-controlled oscillator 108 (a frequency control step) and sending frequency offset control means 118 (a sending frequency offset control step).

6 Claims, 5 Drawing Sheets

COMMUNICATIONS APPARATUS, FREQUENCY CONTROL METHOD FOR COMMUNICATIONS APPARATUS, AND RECORDING MEDIUM

BACKGROUND OF THE INVENTION

The present invention relates to communications apparatus such as a mobile telephone set to perform mobile communications, a frequency control method for communications apparatus, and a recording medium on which a program to execute the frequency control method is recorded, and in particular, to communications apparatus, a frequency control method for communications apparatus, and a recording medium which allow frequency offset correction without degradation in the accuracy of the sending or sending/receiving reference frequency and demodulation characteristics, despite degradation in the accuracy caused by nonlinearity, temperature characteristics and secular change of a voltage-controlled oscillator or reference oscillator.

FIG. 4 is a block diagram of related communications apparatus equipped with a frequency offset correction feature (hereinafter referred to as a first related art).

In FIG. 4, communications apparatus according to the first related art comprises antennas 401 and 411, mixers 402 and 412, local oscillators 403 and 413, voltage-controlled oscillators 404, an A/D converter 405, D/A converters 406 and 415, demodulating means 407, receiving frequency offset estimating means 408, modulating means 417 and a central processing unit (CPU) 421.

According to communications apparatus of the first conventional related art, reception signals received via the antenna 401 are frequency-converted via the mixer 402, and a frequency offset estimate FOS is determined via the receiving frequency offset estimating means 408. Reference frequency control, so-called the AFC (Auto Frequency Control) is made by using the CPU 421 to feedback a control value based on the determined frequency offset estimate FOS to the voltage-controlled oscillator 404 via the D/A converter 406.

While the demodulating means 407 demodulates intermediate-frequency signals frequency-converted by the mixer 402 and outputs upstream control data DTD and downstream control data DCD to the CPU 421, the CPU 421 can control the sending reference frequency by using the downstream control data DCD from the demodulating means 407, besides the AFC processing. In this case, a frequency offset control value is generated by the CPU 421 based on a sending reference frequency command on the downstream control data DCD, and fed back to the voltage-controlled oscillator 404 via the D/A converter 406.

FIG. 5 is a block diagram of another conventional communications apparatus equipped with the frequency offset correction feature (hereinafter referred to as a second related art).

In FIG. 5, communications apparatus according to the second related art comprises antennas 401 and 411, mixers 402 and 412, local oscillators 403 and 413, a reference oscillators 404, an A/D converter 405, D/A converters 406 and 515, demodulating means 407, receiving frequency offset estimating means 408, modulating means 517, sending frequency offset estimating means 518 and a central processing unit (CPU) 521.

Also, according to communications apparatus of the second related art, receive signals received via the antenna 401 are frequency-converted via the mixer 402, and a frequency offset estimate FOS is determined via the receiving frequency offset estimating means 408. Reference frequency control, so-called the AFC (Auto Frequency Control) is made by using the CPU 521 to feed back a control value based on the determined frequency offset estimate FOS to the sending frequency offset control means 518 as a frequency offset control value FOC.

While the demodulating means 407 demodulates intermediate-frequency signals frequency-converted by the mixer 402 and outputs upstream control data DTD and downstream control data DCD to the CPU 521, the CPU 521 can control the sending reference frequency by using the downstream control data DCD from the demodulating means 407, besides the AFC processing. In this case, a frequency offset control value FOC is generated by the CPU 521 based on a sending reference frequency command on the downstream control data DCD and fed back to the sending frequency offset control means 518.

According to the conventional communications apparatus equipped with the frequency offset correction feature of the first related art, however, it is a common practice that a VCTCXO (a VCO (voltage controlled oscillator) equipped with a temperature-compensated crystal oscillator (TCXO)) as a reference oscillator is used in terms of power consumption and apparatus cost. This causes degradation in the accuracy of the VCTCXO due to its nonlinearity, temperature characteristics and secular change. As mentioned earlier, According to communications apparatus which controls the sending reference frequency by using downstream control data DCD, it is necessary to feed back the sending reference frequency command to the voltage-controlled oscillator (VCTCXO) 404. In this case, such apparatus cannot control the sending reference frequency with high accuracy due to nonlinearity, temperature characteristics and secular change of the VCTCXO, thus inviting degradation in the accuracy of the sending reference frequency.

Similarly, according to communication apparatus which controls, by using the downstream control data DCD, the sending reference frequency immediately after a new channel is assigned, such as via a handover, it is necessary to feed back the sending reference frequency command to the voltage-controlled oscillator (VCTCXO) 404. In this case, such apparatus cannot control the sending reference frequency with high accuracy due to nonlinearity, temperature characteristics and secular change of the VCTCXO, thus inviting degradation in the accuracy of the sending reference frequency.

According to the conventional communications apparatus equipped with the frequency offset correction feature of the second related art, however, it is a common practice that a temperature-compensated crystal oscillator as a reference oscillator 404 is used in terms of power consumption and apparatus cost. This causes degradation in the accuracy of the TCXO due to its initial deviation, temperature characteristics and secular change. That is, a receiving frequency offset caused by initial deviation, temperature characteristics and secular change inherent to the TCXO invites degradation in the demodulation characteristics in the demodulating means 407.

SUMMARY OF THE INVENTION

The invention, in view of the aforementioned circumstances and problems, aims at providing communications apparatus, a frequency control method for communications apparatus, and a recording medium which allow high-accuracy frequency offset correction without degradation in the accuracy of the sending or sending/receiving reference frequency and demodulation characteristics, despite degradation in the accuracy caused by nonlinearity, temperature characteristics and secular change of a voltage-controlled oscillator (VCTCXO) or reference oscillator (TCXO).

To solve the aforementioned problems, communications apparatus according to the first aspect of the invention comprises receiving frequency offset estimating means for estimating a receiving frequency offset based on receive signals, a voltage-controlled oscillator for controlling a local oscillator frequency based on an estimate determined by the receiving frequency offset estimating means, demodulating means for demodulating the receive signals to obtain control data, and sending frequency offset control means for controlling a sending frequency offset based on control data obtained by the demodulating means, wherein a sending reference frequency is controlled by using the voltage-controlled oscillator and the sending frequency offset control means.

According to the second aspect of the invention, communications apparatus performing TDMA communications comprises receiving frequency offset estimating means for estimating a receiving frequency offset based on receive signals, a voltage-controlled oscillator for controlling a local oscillator frequency based on an estimate determined by the receiving frequency offset estimating means, demodulating means for demodulating the receive signals to obtain control data, and sending frequency offset control means for controlling a sending frequency offset by using the local oscillator frequency as a reference, based on downstream control data obtained by the demodulating means, the voltage-controlled oscillator, upon assignment of a new channel, controlling a sending frequency offset based on the downstream control data obtained by the demodulating means to pull the local oscillator frequency, the sending frequency offset control means controlling the sending frequency offset based on the downstream control data obtained by the demodulating means, by using as a reference a local oscillator frequency provided when or immediately before a new channel is assigned, from assignment of a new channel to completion of pulling of the local oscillator frequency.

A frequency control method for communications apparatus according to the third aspect of the invention comprises a receiving frequency offset estimating step for estimating a receiving frequency offset based on receive signals, a frequency control step for controlling a local oscillator frequency based on an estimate determined by the receiving frequency offset estimating step, a demodulating step for demodulating the receive signals to obtain control data, and a sending frequency offset control step for controlling a sending frequency offset based on control data obtained by the demodulating step, wherein a sending reference frequency is controlled by using the frequency control step and the sending frequency offset control step.

According to the fourth aspect of the invention, a frequency control method for communications apparatus performing TDMA communications, comprises a receiving frequency offset estimating step for estimating a receiving frequency offset based on receive signals, a frequency control step for controlling a local oscillator frequency based on an estimate determined by the receiving frequency offset estimating step, a demodulating step for demodulating the receive signals to obtain control data, and a sending frequency offset control step for controlling a sending frequency offset by using the local oscillator frequency as a reference, based on downstream control data obtained by the demodulating step, the frequency control step, upon assignment of a new channel, controlling a sending frequency offset based on the downstream control data obtained by the demodulating step to pull the local oscillator frequency, the sending frequency offset control step controlling the sending frequency offset based on the downstream control data obtained by the demodulating step, by using as a reference a local oscillator frequency provided when or immediately before a new channel is assigned, from assignment of a new channel to completion of pulling of the local oscillator frequency.

A computer-readable recording medium according to the fifth aspect of the invention is a frequency control method for communications apparatus according to the third or fourth aspect of the invention which is stored as a program to be executed by a computer.

According to communications apparatus of the first aspect of the invention, a frequency control method for communications apparatus of the third aspect of the invention, and a recording medium of the fifth aspect of the invention, a receiving frequency offset is estimated, based on receive signals via receiving frequency offset estimating means (a receiving frequency offset estimating step), a local oscillator frequency is controlled, based on an estimate determined by the receiving frequency offset estimating means (receiving frequency offset estimating step) via a voltage-controlled oscillator (a frequency control step), receive signals are demodulated to obtain downstream control data via demodulating means (a demodulating step), and a sending frequency offset is controlled via sending frequency offset control means (a sending frequency offset control step) based on downstream control data obtained by the demodulating means (demodulating step), to control a sending reference frequency by using the voltage-controlled oscillator (frequency control step) and the sending frequency offset control means (sending frequency offset control step).

According to communications apparatus of the first aspect of the invention, a frequency control method for communications apparatus of the third aspect of the invention, and a recording medium of the fifth aspect of the invention, control of a reference frequency (local oscillator frequency) or AFC is made by feeding back a frequency offset estimate to the voltage-controlled oscillator, and the frequency offset between sending and receiving frequencies is corrected by feeding back a frequency offset control value which is based on for example a sending reference frequency command on control data to sending frequency offset control means, to control a sending reference frequency by using both a voltage-controlled oscillator (a frequency control step) and sending frequency offset control means (a sending frequency offset control step). This allows high-accuracy frequency offset correction without degradation in the accuracy of the sending reference frequency and demodulation characteristics, despite degradation in the accuracy caused by nonlinearity, temperature characteristics and secular change of a voltage-controlled oscillator (VCTCXO) or reference oscillator (TCXO).

According to communications apparatus of the second aspect of the invention, a frequency control method for communications apparatus of the fourth aspect of the invention, and a recording medium of the fifth aspect of the invention, a receiving frequency offset is estimated, based on receive signals via receiving frequency offset estimating means (a receiving frequency offset estimating step), a local oscillator frequency is controlled, based on an estimate determined by the receiving frequency offset estimating means (receiving frequency offset estimating step) via a voltage-controlled oscillator (a frequency control step), downstream control data is obtained by demodulating means (a demodulating step), and a sending frequency offset is controlled via sending frequency offset control means (a sending frequency offset control step) based on downstream control data obtained by the demodulating means (demodulating step) by using a local oscillator frequency as a reference. When a new channel is assigned, a sending frequency offset is controlled, based on downstream control data obtained by the demodulating means (demodulating step) to pull the local oscillator frequency via a voltage-controlled oscillator (a frequency control step), and a sending frequency offset is controlled, based on downstream control data obtained by the demodulating means (demodulating step), via the sending frequency offset control means (sending frequency offset control step) by using as a reference the local oscillator frequency provided when or immediately before a new channel is assigned, from assignment of a new channel to completion of pulling of the local oscillator frequency.

For example, when a new channel is assigned via for example a handover command, a new reference frequency (local oscillator frequency) via AFC is pulled by feeding back a frequency offset control value which is based on a receiving reference frequency command on downstream control data to a voltage-controlled oscillator to control a sending frequency offset. From assignment of a new channel to completion of pulling of the reference frequency, a sending frequency offset is controlled by (feeding back a frequency offset control value) which is based on a receiving reference frequency command on downstream control data to sending frequency offset control means, by using as a reference the reference frequency provided when or immediately before a new channel is assigned, not a reference frequency provided in the course of pulling the reference frequency. This allows high-accuracy frequency offset correction without degradation in the accuracy of the sending/receiving reference frequency and demodulation characteristics immediately after a new channel is assigned, despite degradation in the accuracy caused by nonlinearity, temperature characteristics and secular change of a voltage-controlled oscillator (VCTCXO) or reference oscillator (TCXO).

DETAILED DESCRIPTION OF THE PREFERRED EMBODIMENTS

Embodiments of communications apparatus, a frequency control method for communication apparatus and a recording medium according to the invention will be detailed below with reference to drawings, in the order of the first embodiment and the second embodiment. In the description of each embodiment, communications apparatus and a frequency control method for communication apparatus according to the invention will be detailed while a recording medium according to the invention will be covered by the description of the frequency control method for communication apparatus below, because such medium is a recording medium on which a program for executing the frequency control method for communication apparatus.

First Embodiment

Figure 1:
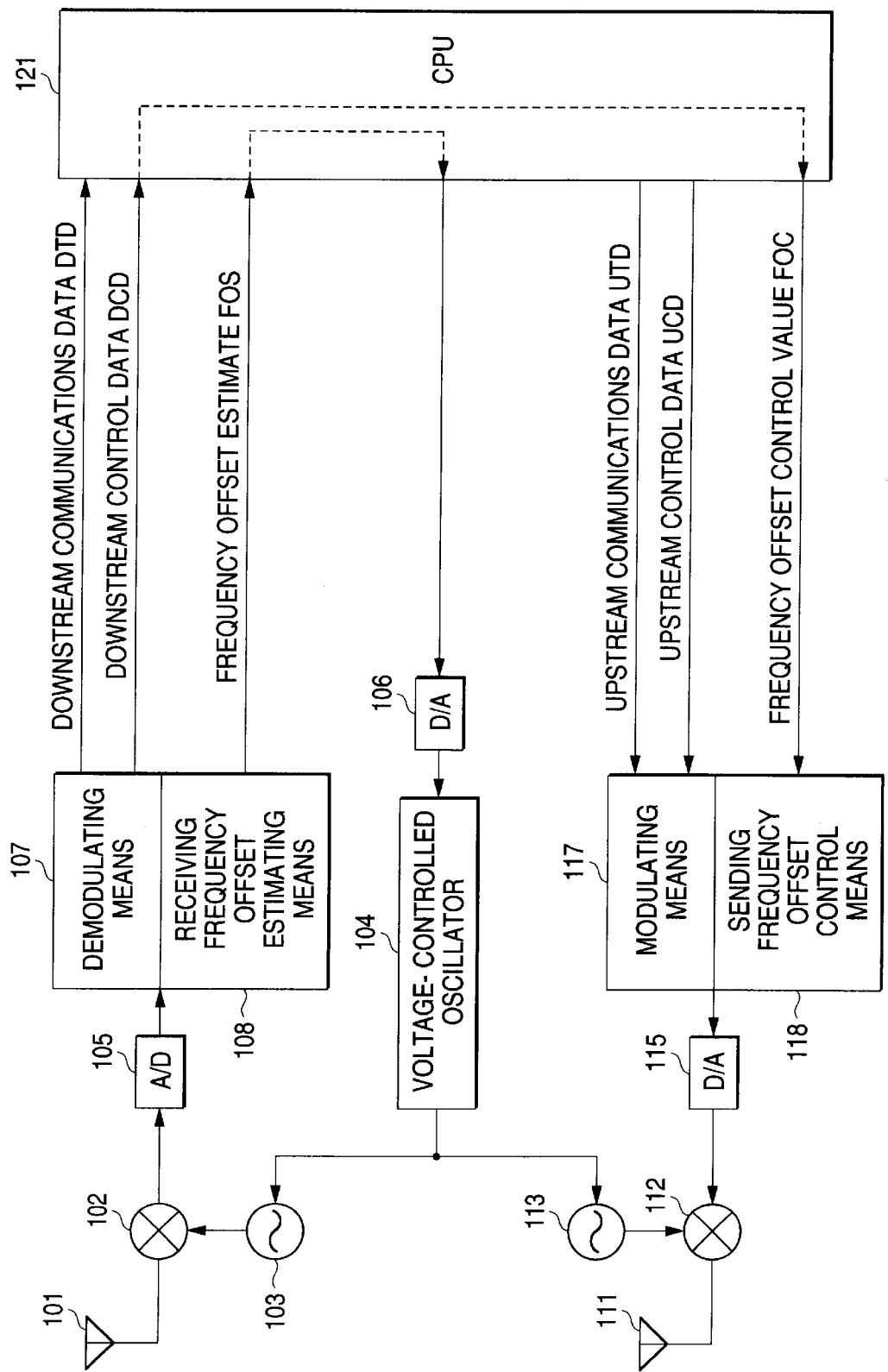
FIG. 1 is a block diagram of communications apparatus according to the first embodiment of the invention.

FIG. 1 is a block diagram of communications apparatus according to the first embodiment of the invention. In FIG. 1, communications apparatus according to the embodiment comprises antennas 101 and 111, mixers 102 and 112, local oscillators 103 and 113, a voltage-controlled oscillator 104, an A/D converter 105, D/A converters 106 and 115, demodulating means 107, receiving frequency offset estimating means 108, modulating means 117, sending frequency offset control means 118 and a central processing unit (CPU) 121.

According to communications apparatus of the embodiment, receive signals received via the antenna 101 are frequency-converted to intermediate signals by using the output of the local oscillator 103 via the mixer 102, the resulting signals are converted to digital signals via the A/D converter 105, and a frequency offset estimate FOS is determined via the receiving frequency offset estimating means 108. Control of a reference frequency (local oscillator frequency), so-called the AFC (Auto Frequency Control), is made by using the CPU 121 to feed back a control value based on the determined frequency offset estimate FOS to the voltage-controlled oscillator 104 via the D/A converter 106.

The demodulating means 107 demodulates intermediate-frequency signals (digital signals) frequency-converted by the mixer 102 and outputs downstream transmission data DTD and downstream control data DCD to the CPU 121. The CPU 121 can control the sending reference frequency by using the downstream control data DCD from the demodulating means 107, besides the AFC processing. In this case, a control value from the CPU 121 is fed back as a frequency offset control value FOC to sending frequency offset means 118, based on a sending reference frequency command on downstream control data DCD.

Figure 2:
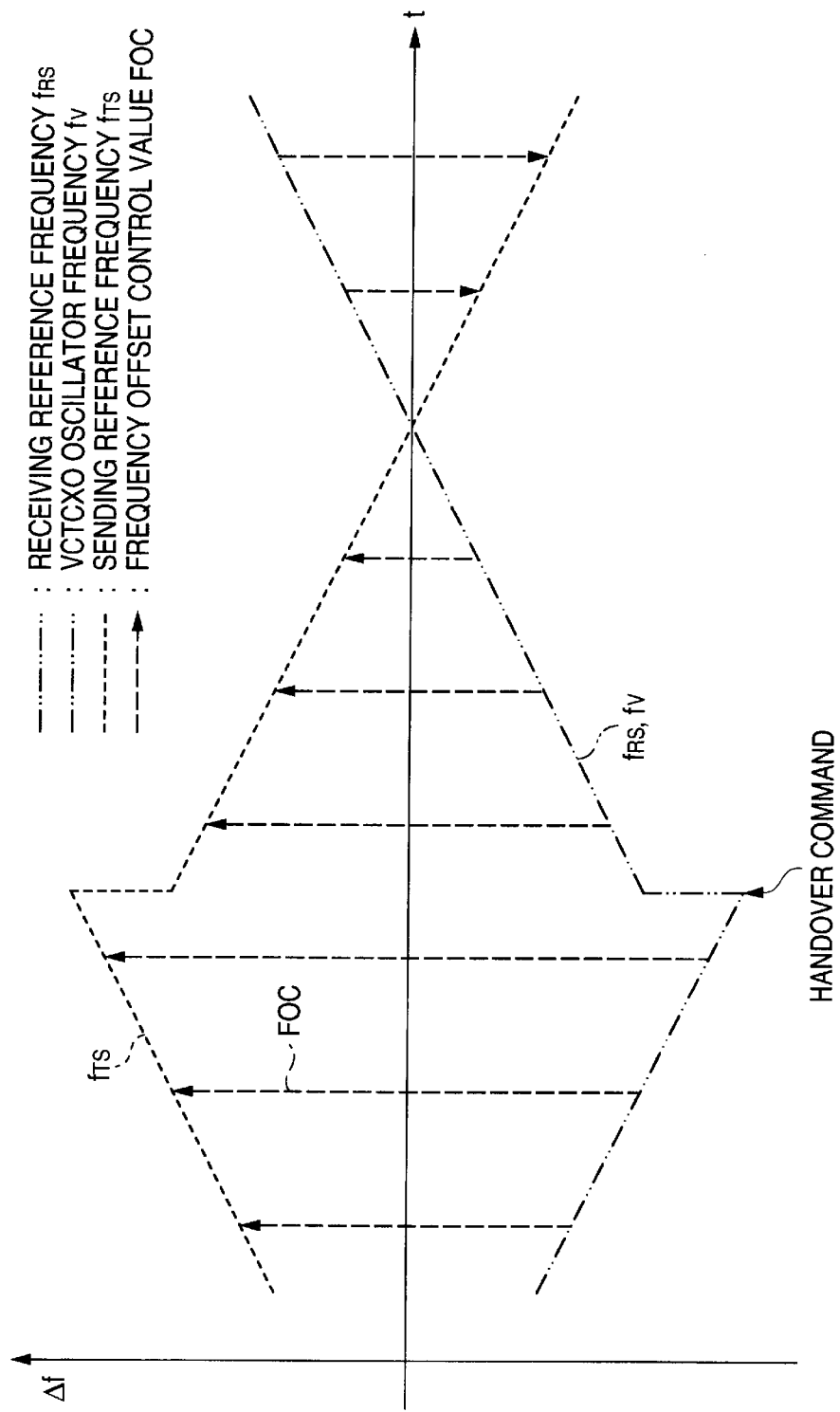
FIG. 2 is an explanatory drawing illustrating the concept of frequency offset correction in communications apparatus according to the first embodiment.

FIG. 2 is an explanatory drawing illustrating the concept of frequency offset correction in communications apparatus according to the embodiment. In FIG. 2, two-dot chain lines represent the time locus of a receiving reference frequency fRS and the oscillator frequency (local oscillator frequency) of a voltage-controlled oscillator 104 (VCTCXO) fV. Dotted lines represent the time locus of a sending reference frequency fTS, and dotted lines with arrows represent the amount and direction of the frequency offset control value FOC.

The receiving reference frequency fRS is controlled by the aforementioned AFC so that the receiving reference frequency fRS and the VCTCXO oscillator frequency fV follow an identical time locus.

The sending reference frequency fTS is symmetrical with the receiving reference frequency fRS. This is because the sending reference frequency fTS is controlled via a sending reference frequency command on the downstream control data DCD from a base station so that a mobile station (the communications apparatus) can correct a frequency offset between sending and receiving frequencies corresponding to the Doppler effect caused by the relative speed of the mobile station to the base station.

Specifically, according to communications apparatus of the embodiment, the frequency offset value FOC is output via the CPU 121 based on a sending reference frequency command on the downstream control data DCD and fed back to the sending frequency offset means 118, in order to realize frequency control.

In FIG. 1, demodulating means 107, receiving frequency offset estimating means 108, modulating means 117, sending frequency offset control means 118 and a central processing unit (CPU) 121 can be realized via a DSP (signal processor). In this case, the frequency control method for communications apparatus according to the embodiment is realized via a program executed on the DSP.

To summarize the frequency control method, a receiving frequency offset is estimated, based on receive signals via a receiving frequency offset estimating step, the local oscillator frequency of a voltage-controlled oscillator 104 is controlled, based on an estimate determined by the receiving frequency offset estimating step via a frequency control step, receive signals are demodulated to obtain downstream control data via a demodulating step, and a sending frequency offset is controlled via a sending frequency offset control step based on downstream control data obtained by the demodulating step, to control a sending reference frequency by using the frequency control step and the sending frequency offset control step.

As described earlier, according to communications apparatus and a frequency control method for communications apparatus of the embodiment, control of a reference frequency (local oscillator frequency) is made by feeding back a frequency offset estimate FOS to the voltage-controlled oscillator 104, and the frequency offset between sending and receiving frequencies is corrected by feeding back a frequency offset control value FOC which is based on a sending reference frequency command on downstream control data DCD to sending frequency offset control means 118, to control a sending reference frequency by using both a voltage-controlled oscillator 114 (a frequency control step) and sending frequency offset control means 118 (a sending frequency offset control step). This allows high-accuracy frequency offset correction without degradation in the accuracy of the sending reference frequency and demodulation characteristics, despite degradation in the accuracy caused by nonlinearity, temperature characteristics and secular change of a voltage-controlled oscillator 104 (VCTCXO) or reference oscillator (TCXO).

Second Embodiment

Next, communications apparatus and a frequency control method for communications apparatus according to the second embodiment of the invention will be described. Configuration of the communication apparatus according to the embodiment is shown in FIG. 1, same as the first embodiment. The communications apparatus according to the second embodiment differs from the first embodiment that the second embodiment uses a different control of frequency offset correction immediately after a handover command whereby a new channel is assigned and that the second embodiment is only applicable to communications apparatus for mobile stations such as mobile telephone sets for performing the TDMA (Time Division Multiple Access) communications.

Figure 3:
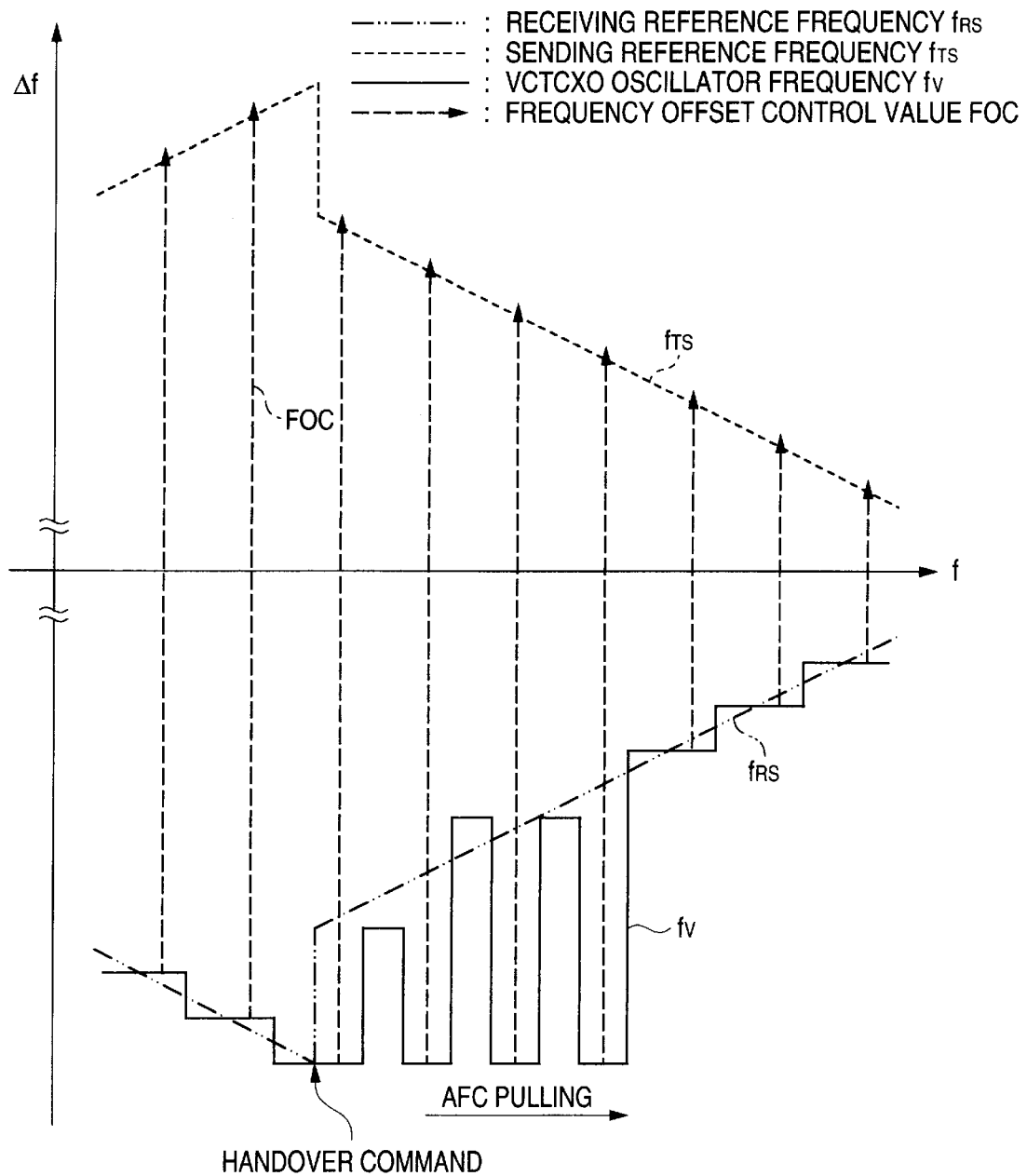
FIG. 3 is an explanatory drawing illustrating the concept of frequency offset correction in communications apparatus according to the second embodiment.
Figure 4:
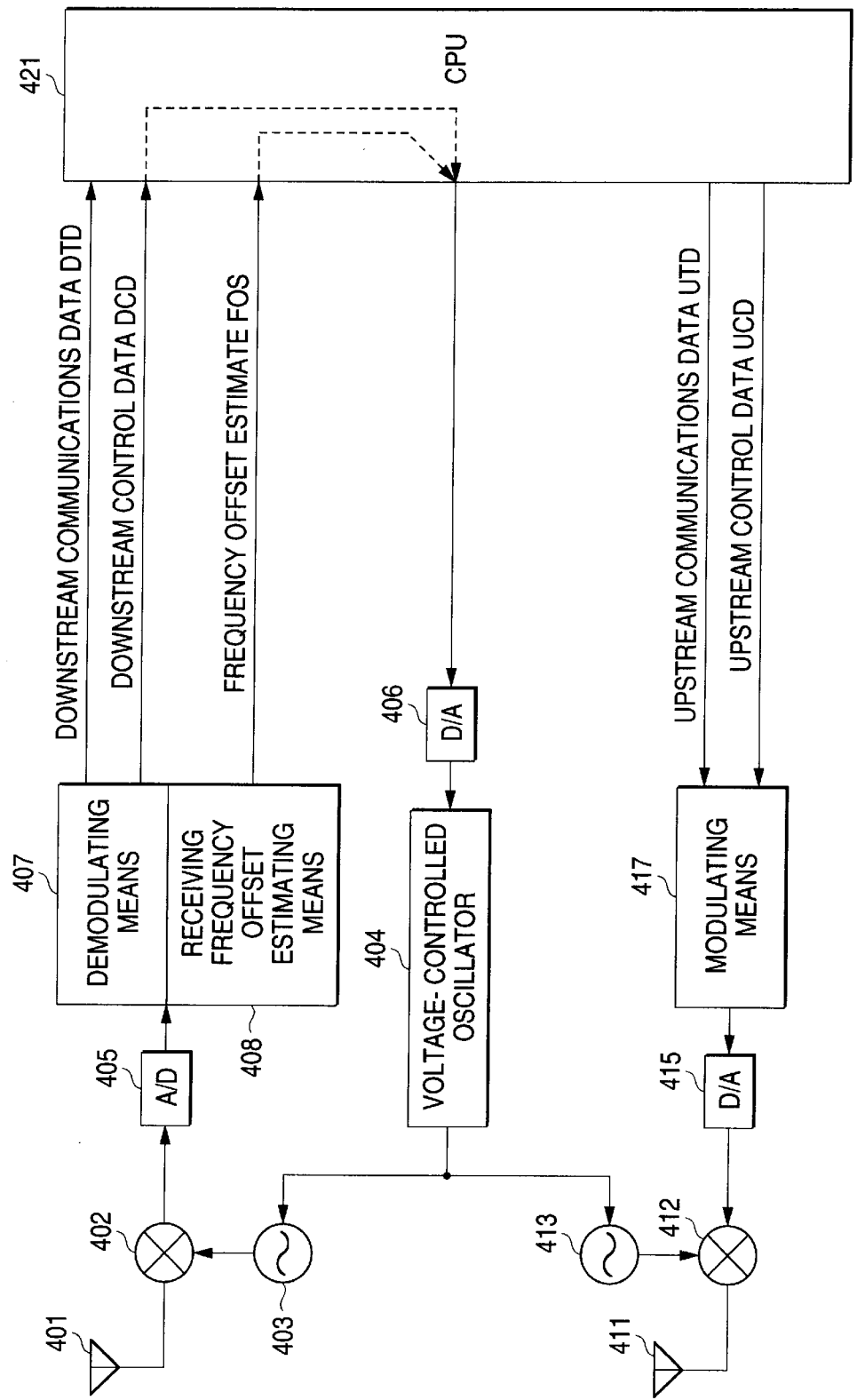
FIG. 4 is a block diagram of conventional communications apparatus equipped with a frequency offset correction feature according to the first conventional embodiment.
Figure 5:
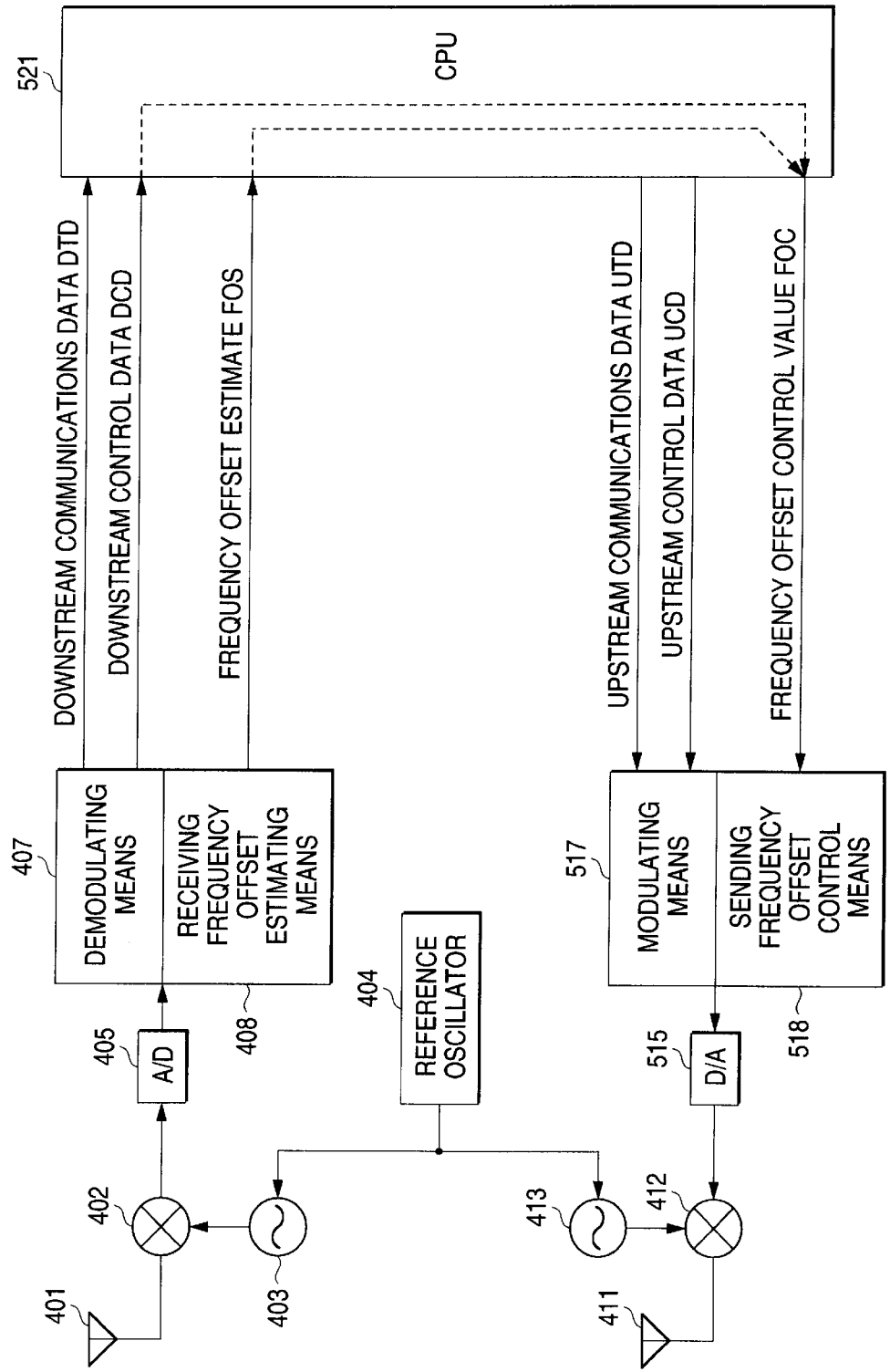
FIG. 5 is a block diagram of conventional communications apparatus equipped with the frequency offset correction feature according to the second conventional embodiment.

FIG. 3 is an explanatory drawing illustrating the concept of frequency offset correction in communications apparatus according to the embodiment. In FIG. 3, two-dot chain lines represent the time locus of a receiving reference frequency fRS. Doted lines represent the time locus of a sending reference frequency fTS. Solid lines represent the time locus of an oscillator frequency (local oscillator frequency) of a voltage-controlled oscillator 104 (VCTCXO) fV and dotted lines with arrows represent the amount and direction of the frequency offset control value FOC.

In FIG. 3, the receiving frequency fRS is controlled via the AFC for feeding back a control value which is based on a frequency offset estimate FOS to a voltage-controlled oscillator 104 via a CPU 121. Immediately after a handover, the receiving frequency fRS is controlled by feeding back a control value which is based on a receiving reference frequency command among handover commands on downstream control data DCD to the voltage-controlled oscillator 104 via the CPU 121. In this case, the receiving reference frequency fRS cannot be controlled with high accuracy due to degradation in the accuracy caused by nonlinearity, temperature characteristics and secular change of the VCTCXO typically used as a voltage-controlled oscillator 104. Thus, a process for pulling a reference frequency via the AFC is required immediately after a handover command.

The sending reference frequency fTS is symmetrical with the receiving reference frequency fRS. This is because the sending reference frequency fTS is controlled via a sending reference frequency command on the downstream control data DCD from a base station so that a mobile station (the communications apparatus) can correct a frequency offset between sending and receiving frequencies corresponding to the Doppler effect caused by the relative speed of the mobile station to the base station. Specifically, the frequency offset value FOC is output via the CPU 121 based on a sending reference frequency command on the downstream control data DCD and fed back to the sending frequency offset means 118, in order to realize the frequency control.

Immediately after a handover command, however, the process of pulling a reference frequency via the AFC is not complete. Thus generating a frequency offset control value FOC using the oscillator frequency (local oscillator frequency) of a voltage-controlled oscillator 104 (VCTCXO) fV as a reference prevents a sending reference frequency fTS from being controlled with high accuracy, resulting in degradation in the accuracy of the sending reference frequency fTS. To offset this disadvantage. According to communications apparatus according to the embodiment, from immediately after a handover to completion of a reference frequency pulling process via the AFC, a frequency offset control value FOC is generated using the oscillator frequency of a voltage-controlled oscillator 104 (VCTCXO) fV immediately before a handover as a reference, based on a sending reference frequency command on downstream control data DCD and the FOC is fed back to sending frequency offset control means 118. Such a control approach is possible According to communications apparatus which performs TDMA communications.

In FIG. 1, same as the first embodiment, demodulating means 107, receiving frequency offset estimating means 108, modulating means 117, sending frequency offset control means 118 and a central processing unit (CPU) 121 can be realized via a DSP (signal processor). In this case, the frequency control method for communications apparatus according to the embodiment is realized via a program executed on the DSP.

To summarize the frequency control method, same as the first embodiment, a receiving frequency offset is estimated, based on receive signals via a receiving frequency offset estimating step, the local oscillator frequency of a voltage-controlled oscillator 104 is controlled, based on an estimate determined by the receiving frequency offset estimating step via a frequency control step, receive signals are demodulated to obtain downstream control data via a demodulating step, and a sending frequency offset is controlled via a sending frequency offset control step based on downstream control data obtained by the demodulating step, to control a sending reference frequency by using the frequency control step and the sending frequency offset control step. When a new channel is assigned, the voltage-controlled oscillator 104 is controlled via a frequency control step based on downstream control data via a demodulating step to pull a local oscillator frequency to control a sending frequency offset. From assignment of a new channel to completion of pulling of the reference frequency, a sending frequency offset is controlled, based on the downstream control data obtained by the demodulating step, by using as a reference a local oscillator frequency provided when or immediately before a new channel is assigned.

As described earlier, according to communications apparatus and a frequency control method for communications apparatus of the embodiment, when a new channel is assigned via for example a handover command, a new reference frequency (local oscillator frequency) via AFC is pulled by feeding back a frequency offset control value FOS which is based on a receiving reference frequency command on downstream control data to a voltage-controlled oscillator 104 to control a sending frequency offset. From assignment of a new channel to completion of pulling of the reference frequency, a sending frequency offset is controlled by feeding back a frequency offset control value FOC which is based on a sending reference frequency command on downstream control data DCD to sending frequency offset control means 118, by using as a reference the reference frequency provided immediately before a handover command, not a reference frequency provided in the course of pulling the reference frequency. This allows high-accuracy frequency offset correction without degradation in the accuracy of the sending/receiving reference frequency and demodulation characteristics immediately after a handover command, despite degradation in the accuracy caused by nonlinearity, temperature characteristics and secular change of a voltage-controlled oscillator 104 (VCTCXO) or reference oscillator (TCXO).

As described earlier, according to communications apparatus and a frequency control method for communications apparatus of the invention, control of a local oscillator frequency is made by feeding back a frequency offset estimate to the voltage-controlled oscillator, and the frequency offset between sending and receiving frequencies is corrected by feeding back a frequency offset control value which is based on for example a sending reference frequency command on control data to sending frequency offset control means, to control a sending reference frequency by using both a voltage-controlled oscillator (a frequency control step) and sending frequency offset control means (a sending frequency offset control step). This enables it to provide communications apparatus, a frequency control method for communications apparatus, and a recording medium which allow frequency offset correction without degradation in the accuracy of the sending reference frequency and demodulation characteristics, despite degradation in the accuracy caused by nonlinearity, temperature characteristics and secular change of a voltage-controlled oscillator or reference oscillator.

According to communications apparatus and a frequency control method for communications apparatus of the invention, when a new channel is assigned via for example a handover command, a local oscillator frequency is pulled by feeding back a frequency offset control value which is based on a receiving reference frequency command on downstream control data to a voltage-controlled oscillator to control a sending frequency offset. From assignment of a new channel to completion of pulling of the reference frequency, a sending frequency offset is controlled by feeding back a frequency offset control value which is based on a sending reference frequency command on downstream control data to sending frequency offset control means, by using as a reference the reference frequency provided when or immediately before a new channel is assigned, not a reference frequency provided in the course of pulling the reference frequency. This allows high-accuracy frequency offset correction without degradation in the accuracy of the sending/receiving reference frequency and demodulation characteristics immediately after a new channel is assigned, despite degradation in the accuracy caused by nonlinearity, temperature characteristics and secular change of a voltage-controlled oscillator 104 (VCTCXO) or reference oscillator (TCXO).

What is claimed is:

1. Communications apparatus comprising:

receiving frequency offset estimating means for estimating a receiving frequency offset based on receive signals;

a voltage-controlled oscillator for controlling a local oscillator frequency based on an estimate determined by said receiving frequency offset estimating means;

demodulating means for demodulating said receive signals to obtain control data; and sending frequency offset control means for controlling a sending frequency offset based on control data obtained by said demodulating means;

wherein a sending reference frequency is controlled by using said voltage-controlled oscillator and said sending frequency offset control means.

2. Communications apparatus performing TDMA communications comprising:

receiving frequency offset estimating means for estimating a receiving frequency offset based on receive signals;

a voltage-controlled oscillator for controlling a local oscillator frequency based on an estimate determined by said receiving frequency offset estimating means;

demodulating means for demodulating said receive signals to obtain control data; and sending frequency offset control means for controlling a sending frequency offset by using said local oscillator frequency as a reference, based on downstream control data obtained by said demodulating means, wherein said voltage-controlled oscillator, upon assignment of a new channel, controls a sending frequency offset based on the downstream control data obtained by said demodulating means to pull said local oscillator frequency and said sending frequency offset control means controls the sending frequency offset based on the downstream control data obtained by said demodulating means, by using as a reference a local oscillator frequency provided when or immediately before a new channel is assigned, from assignment of a new channel to completion of pulling of said local oscillator frequency.

3. A frequency control method for communications apparatus comprising:

a receiving frequency offset estimating step for estimating a receiving frequency offset based on receive signals;

a frequency control step for controlling a local oscillator frequency based on an estimate determined by said receiving frequency offset estimating step;

a demodulating step for demodulating said receive signals to obtain control data; and a sending frequency offset control step for controlling a sending frequency offset based on control data obtained by said demodulating step;

wherein a sending reference frequency is controlled by using said frequency control step and said sending frequency offset control step.

4. A frequency control method for communications apparatus performing TDMA communications, comprising:

a receiving frequency offset estimating step for estimating a receiving frequency offset based on receive signals;

a frequency control step for controlling a local oscillator frequency based on an estimate determined by said receiving frequency offset estimating step;

a demodulating step for demodulating said receive signals to obtain control data; and a sending frequency offset control step for controlling a sending frequency offset by using said local oscillator frequency as a reference, based on downstream control data obtained by said demodulating step, wherein said frequency control step, upon assignment of a new channel, controls a sending frequency offset based on the downstream control data obtained by said demodulating step to pull said local oscillator frequency, and that said sending frequency offset control step controls the sending frequency offset based on the downstream control data obtained by said demodulating step, by using as a reference a local oscillator frequency provided when or immediately before a new channel is assigned, from assignment of a new channel to completion of pulling of said local oscillator frequency.

5. A computer-readable recording medium on which a frequency control method for communications apparatus according to claim 3 is stored as a program to be executed by a computer.

6. A computer-readable recording medium on which a frequency control method for communications apparatus according to claim 4 is stored as a program to be executed by a computer.

* * * * *